Oct. 24, 1972 A. REMBAUM 3,700,603

HEAT DETECTION AND COMPOSITIONS AND DEVICES THEREFOR

Filed June 25, 1969 2 Sheets-Sheet 1

INVENTOR.
ALAN REMBAUM

BY Lindenberg & Freilich
ATTORNEYS.

INVENTOR.
ALAN REMBAUM
BY Lindenberg & Freilich
ATTORNEYS.

United States Patent Office 3,700,603

Patented Oct. 24, 1972

3,700,603

HEAT DETECTION AND COMPOSITIONS AND DEVICES THEREFOR

Alan Rembaum, Altadena, Calif., assignor to California Institute of Technology, Pasadena, Calif.

Filed June 25, 1969, Ser. No. 836,280
Int. Cl. C09d *11/00;* C09k *3/00, 11/12*
U.S. Cl. 252—408 10 Claims

ABSTRACT OF THE DISCLOSURE

Temperature change of a substrate such as a microelectronic component is sensed and detected by means of a mixture of a weak molecular complex of an electron donor compound such as an organic amine and an electron acceptor compound such as nitroaromatic compound. The mixture is encapsulated in a clear binder such as a vinyl resin.

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

BACKGROUND OF THE INVENTION

(1) Field of the invention

The present invention relates to thermochromic compositions, methods of indicating a temperature change utilizing said compositions and to devices incorporating said compositions. More particularly the present invention relates to a method of detecting the temperature level of an electronic circuit or other device utilizing a stable composition containing weakly associated organic chemical complexes which undergo a reversible and characteristic color change at a specific temperature.

(2) Description of the prior art

The applications for practical and effective thermochromic compositions are numerous. For example, they could be incorporated in display devices such as street signs, color television screens, clock faces, and various electronic color switching devices. Only a small amount of power would be required to raise the temperature of the substrate to switch on the devices. The devices would have small dimensions, low power requirements and quite intense brightness. With a stable composition capable of reversible color change at a very sharp temperature cutoff range, a temperature sensing layer can be applied to a temperature labile substrate such as an electronic component to provide an immediate indication of the impending temperature rise to a temperature level at which the component would be damaged or destroyed. The detection problem is especially important in electronic modules mounted in small and inaccessible areas.

The known color-sensitive crayon materials operate at rather high temperatures above 100° C. and are not reversible. Other compounds exhibiting color change have been identified and have been academically investigated for many years. For example colored solutions and melts of weakly bonded organic chemical complexes formed of an electron-donor and electron acceptor have been observed to undergo color change when cooled below solidification temperature. These complexes were the subject of a study by Hammond et al., published November 1966 in a document identified as NOTS TP 4185. An application Ser. No. 805,006, now Pat. No. 3,576,604 has been filed on Mar. 6, 1969, disclosing a method of heat detection utilizing a mixture of weakly interacting acceptor-donor chemicals which undergo a sharp color change at a specific temperature. According to the present invention these complexes are found to be unstable and to sublime or decompose when applied to substrates without further treatment.

OBJECTS AND SUMMARY OF THE INVENTION

It is therefore an object of the invention to provide thermochromic compounds in a stable and utilizable form.

Another object of the invention is the provision of a method of indicating the temperature of various substrates by applying to the substrate compounds that reversibly change color over a narrow temperature range.

A further object of the invention is the provision of devices that change color reversibly over specified temperature ranges and methods of utilizing these devices to indicate the rise or fall of temperature of a temperature sensitive substrate.

Yet another object is to provide a simple method for detecting hot spots in electronic circuits mounted in small areas.

A still further object of this invention is the provision of a simple and inexpensive method for detecting hot spots in electronic equipment and particularly in integrated circuitry utilizing a color responsive device that is reversible and reusable over an extended period of service.

These and other objects and many attendant advantages of the invention will become apparent as the description proceeds.

The temperature sensing or indicating device, according to the invention, comprises a temperature sensitive substrate such as an integrated electronic component or a printed circuit board or the like, a thermochromic composition comprising particles of an electron-donor compound weakly associated with particles of an electron-acceptor compound applied to a surface zone of the substrate and means for sealing the compounds to the surface area.

The composition according to the invention comprises a combination of said chemically associated donor and acceptor compounds dispersed in a binder or carrier material preferably of plastic nature such as a resin or glass which seals the compounds from the effects of the environment while permitting the compounds to weakly associate at a first temperature to form a first color and disassociate at a lower temperature to form a second indicative color.

Temperature sensing is accomplished according to the invention by applying the compounds preferably as a layer to the specified surface zone, applying a layer of sealing or encapsulating material to protect and seal the compounds and monitoring the area to detect a change of color indicative of a change of temperature of the substrate. The substrate may be an electronic circuit as discussed, or other temperature sensitive apparatus surfaces such as those in instruments, conduits and the like, where over-heating can cause serious damage.

The invention will now become better understood by reference to the following detailed description when considered in conjunction with the accompanying drawings.

DESCRIPTION OF THE PREFERRED EMBODIMENTS

Figure 1:
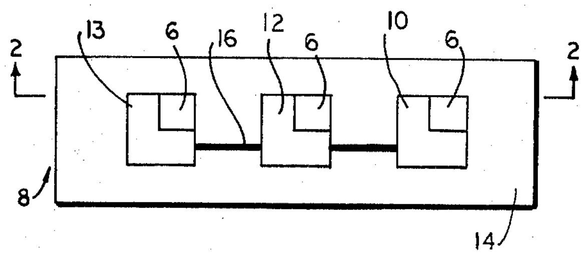
FIG. 1 is a top elevational view of an electronic component incorporating the heat detecting device of the invention.
Figure 2:
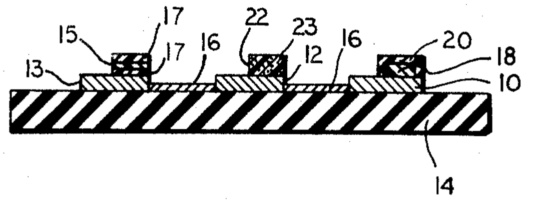
FIG. 2 is a cross-sectional view taken along the line 2—2 of FIG. 1.

The temperature sensing and indicating system according to the invention, comprises a device 8 including a thermochromic composition exhibiting sharp and reversible color changes at specific temperatures applied to a temperature sensitive substrate 14. Referring now to FIG. 1 a very important use of the temperature sensing device is in monitoring the temperature of small and sometimes inaccessible and tightly packed integrated circuit components. The components 10, 12, and 13 are usually mounted on an electrical insulator substrate 14 such as a sheet of Mylar and are electrically interconnected by means of printed circuit lines 16.

In the embodiment of FIG. 1, the temperature sensing device is in the form of an encapsulated layer of thermochromic material applied to a surface of the integrated circuit component. In one form of the device, shown as applied to component 10, a layer of thermochromic material 18 is first applied to the surface suitably by delivering vapors of the material to the surface or by applying a solution of the material to the surface and evaporating the solvent. The layer 18 is enclosed, encapsulated and sealed by means of an outer layer 20 of transparent plastic material suitably a synthetic resin such as a polyacrylate or a vinyl such as polyvinyl alcohol. The clear plastic material may also be a ceramic or glass.

Another embodiment is shown with respect to component 12 and comprises a single layer 22 of clear plastic binder material in which is dispersed particles 23 of the thermochromic material. A further embodiment is shown applied to a surface zone of component 13. The temperature sensing device comprises a layer 15 of thermochromic material sealed between two sheets 17 of clear resin such as polyethylene. The device 6 in this case is placed in contact with the surface of the component during measurement and may be removed after measurement. The material 18 exhibits a sharp color change over a narrow temperature range and on observance of this color change power to the circuit is discontinued until the malfunction is corrected. The material when cool will revert to its original color state and will continuously and repeatedly undergo a color change when raised above the temperature at which color change occurs.

The thermochromic materials according to the invention comprises a combination of an electron donating compound that forms a weak association or complex with an electron accepting material, such that a brightly colored complex is formed in the dissolved or melted state which color disappears or changes to a distinctly different colored form on freezing or solidifying the material. The donor and acceptor compounds are usually organic compounds having a parent structure or being substituted with groups that render the final compound either electron-donating or electron-accepting. When a pair of these compounds are placed in proximity of each other, they will form a weak molecular complex probably involving $\pi$ electrons.

The weakly associated complexes have in common certain characteristic properties. They behave essentially as mixtures in the soliid state but in the liquid state exhibit an interaction evidenced by an absorption band characteristics of the associated components. Hammond et al. characterized the weakly interacting complexes utilizing the dilution equation which may be written in the form:

$$\frac{1}{nD}=\frac{n}{K\epsilon ab}+\frac{1}{a\epsilon} \quad (1)$$

where D is the solution optical density, K and $\epsilon$ are the equilibrium constant for complex formulation and the extinction coefficient at the position of absorption, respectively, $a$ and $b$ are the original concentrations of acceptor and donor and $n$ is dilution. By diluting a standard solution where $n=1.0$ producing varying D and $n$ values, a plot of log D as ordinate versus log $n$ for a typical molecular complex produces a curve of instantaneous gradient:

$$\frac{d \log D}{d \log n}=-1+\frac{1}{1+(Ka+Kb)/n} \quad (2)$$

For weak interactions, large concentrations of acceptor and donor are needed, and a straight line of —2 slope is evidenced.

The systems having weak association usually exhibit an equilibrium constant, K, very near to 0 while those in which a strong complex is formed have an equilibrium constant over 2. X-ray diffraction diagrams of the solidified mixtures of weakly associated complexes show patterns that are superpositions of the components and no additional lines are observed. On the other hand, the complexed systems show characteristically changed patterns. Thus, the melting point point and X-ray studies clearly indicate that no compound is formed and that the colorless solid is a mixture composed of 2-phase aggregates of separate donor and acceptor materials.

A condition which could contribute to the loss of color would be the separation of the acceptor and donor molecules generally into two phases in the solid. This behavior is typical of systems exhibiting the simple eutectic diagrams. The diffraction patterns are clearly those of pure materials in the mixtures and no additional lines are observed. However, the systems producing colored solids show evidence of complexing both in solution and in solid phase and the crystals are built of columns of alternating donor and acceptor molecules. The attractive forces between the donor and acceptor molecule must be sufficient to overcome the tendency of identical molecules to combine in the same crystal lattice in order for complexing to occur. A measure of these attractive forces is derived from solution studies. A useful characterization is that acceptor-donor interaction exhibiting weak association will exhibit an optical density in solution decreasing by the inverse square of dilution and a pure mixed sample will freeze to colorless solids.

Electron donors that form weakly associated complexes useful in the present invention can be selected from organic amines, sterically hindered aromatic compounds such as highly branched alkyl substituted benzenes and condensed ring aromatic compounds. Examples of suitable organic donor compounds are diphenylamine, triphenylamine, N,N-dimethylaniline, anthracene, naphthalene, pyrene, durene, tetrakis-(dimethylamino)-ethylene, hexamethylbenzene, tetramethyl-2-tetrazene, tetramethyl-2-thiourea, 1,3,5-tri-t-butylbenzene or tetra-i-propylbenzene.

The corresponding acceptor compounds may be selected from nitro substituted aliphatic or aromatic compounds, cyclic ketones, heterocyclic compounds and cyano substituted aliphatic or aromatic compounds. Examples of suitable acceptor compounds are chloranil, p-chloronitrobenzene, nitrobenzene, dinitrobenzene, 1,3,5-trinitrobenzene, tetranitromethane, trinitromesitylene, 2,2′, 4,4′, 6,6′, - hexanitrobiphenyl, pyrazine, acridine, p-nitrobenzaldehyde, anthraquinone, tetracyanoethylene, and p-nitroanisole.

Examples of particular weakly complexing systems are diphenylamine-p-chloronitrobenzene which is a colorless solid which yields an orange melt at about 30° C. and diphenylamine-p-chloranil which changes from an opaque substantially colorless solid to a blue melt at about 38° C. Other examples of weak donor-acceptor complexes exhibiting color changes can be found in S.N. 805,006 or NOTS TP 4185.

Melting point and color change determinations were performed on several systems according to the following procedures. Quantities of donor and acceptor crystals were separately weighed and then combined in a mortar. The crystals were ground until a homogeneous mixture was obtained. The mixture was placed on a glass plate and heated until color change was observed. On cooling the colored melt was observed again and any change in appearance noted. The data is presented in the following table.

TABLE I

| Sample | Complex | Mole ratio | M.P. (° C.) | Color change |
|---|---|---|---|---|
| 1 | Diphenylamine-chloranil | 1:1 | 49 to 51 | Chartreuse-very dark green. |
| 2a | Diphenylamine-p-dinitrobenzene | 1:1 | 47 to 49 and 75 to 120 | Tan-red. |
| 2b | do | 2:1 | 47 to 49 | Do. |
| 3 | Triphenylamine-p-dinitrobenzene | 1:1 | 120 to 122 | Beige-deep red. |
| 4a | Triphenylamine-p-chloronitrobenzene | 1:1 | 66 to 68 and 92 to 98 | Light yellow-orange. |
| 4b | do | 1:2 | 66 to 70 (most)<br>70 to 82 (rest) | Off-white-orange. |
| 4c | do | 1:3 | 65 to 70 (most)<br>70 to 85 (rest) | Light yellow-orange. |
| 5 | Diphenylamine-p-chloronitrobenzene | 1:1 | 20 | Light tan-dark yellow. |
| 6 | p-Di-t-butyl benzene-p-chloronitrobenzene | 1:1 | 50 | White-colorless. |
| 7 | Tetraisopropyl benzene-p-chloronitrobenzene | 1:1 | 50 | White-light yellow. |
| 8 | Tetramethylthiourea-p-chloronitrobenzene | 1:1 | 40 | Light yellow-yellow green. |
| 9 | Diphenylamine-trinitromesitylene | 1:1 | 50 | Light grey-dark yellow. |
| 10 | Triphenylamine-trinitromesitylene | 1:1 | 120 | White-light yellow green. |
| 11 | p-Di-t-butpl benzene-p-dinitrobenzene | 1:1 | 50 | White-yellow. |
| 12 | Tetramethylthiourea-p-dinitrobenzene | 1:1 | 65 | Light yellow-orange. |
| 13 | p-Di-t-butyl benzene-chloranil | 1:1 | 65 | Yellow-yellow green. |
| 14 | Tetraisopropyl benzene-chloranil | 1:1 | 120 | Yellow-dark yellow. |
| 15 | Tetramethylthiourea-chloranil | 1:1 | 70 | Yellow-black brown. |

Samples 2a and 4a, 4b and 4c were melted, allowed to solidify and remelted to assure complete mixing of complexing chemicals.

The following examples are offered by way of illustration only. It is to be understood that numerous substitutions, alterations, and modifications, can readily be made by those skilled in the art without departing from the spirit and the scope of the invention.

In a generalized procedure for constructing a temperature indicating device according to the invention, a pair of acceptor-donor compounds known to form a weak association complex and to undergo a known color change at a specified temperature are applied to the surface of the temperature sensitive substrate to be monitored as a prime coating usually in a mutual solvent for the compound pair. The solvent is evaporated and the prime coating is then sealed to the substrate by means of an encapsulating coating of a substantially non-porous and transparent resin such as polyvinyl alcohol. The resin is preferably applied dissolved in a solvent which is a nonsolvent for the acceptor and donor compounds. The solvent for the resin can be a polar liquid such as water or in some cases methanol petroleum ether or aliphatic hydrocarbon solvents.

A specific example of practice follows:

EXAMPLE I

A 1% solution in tetrahydrofuran of an equimolar mixture of diphenylamine and p-dinitrobenzene was sprayed onto an integrated circuit to form a very thin film. When current was allowed to flow through the circuit the crystals apparently vaporized. When cool, the entire circuit was clean and free of the complexing materials. In another attempt a thicker layer of crystals was deposited but again the crystals vaporized when current was applied to the circuit. A third attempt with a very thick layer of crystals resulted in gradual vaporization of the crystals beginning at the outside edge of the circuit working inward.

The circuit was again coated with a thick layer of crystals by spraying the 1% solution onto the circuit and allowing one hour for drying. After drying the crystals were covered with a 2% solution of Elvanol 72–51 (polyvinyl alcohol) in water. The water was allowed to evaporate at room temperature to form a film of polyvinyl alcohol. When power was again applied to the circuit the layer of crystals turned orange. When cool, the layer returned to a substantially colorless state. The circuit could be repeatedly cycled between a hot melted condition of the crystals and a cold crystalline form without any evidence of sublimation or deterioration of the chemicals forming the complex.

Figure 3:
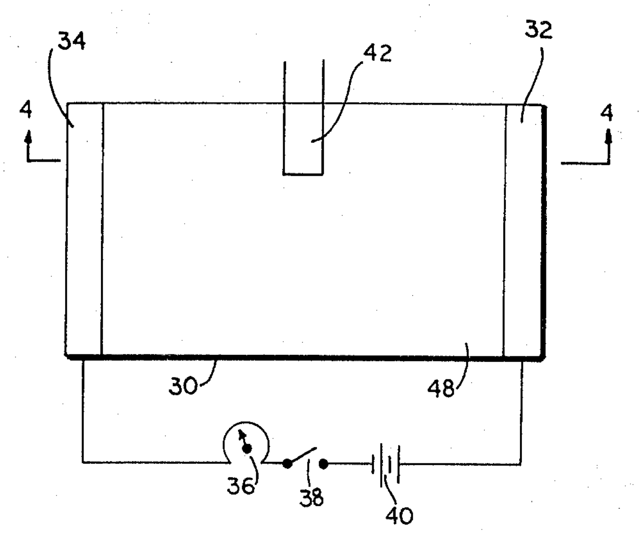
FIG. 3 is a top-elevational view of an electronic color switching device.
Figure 4:
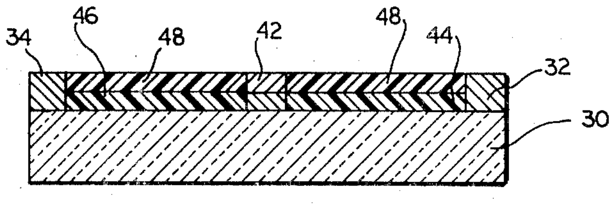
FIG. 4 is a cross-sectional view taken along the line 4—4 of FIG. 3.

Referring now to FIGS. 3 and 4, a multi-colored display device is illustrated which includes in combination a thermoelectric element on which is coated the thermochromic compositions of the invention. The thermoelectric element in this case comprises a sheet of conductive glass 30 about 1.5 square inches in area which is fitted with a set of electrodes 32 and 34 applied to the ends of the conductive face of the sheet. The external circuit for electrodes 32 and 34 includes a rheostat 36, a switch 38 and a battery power source 40.

A thermocouple 42 is applied to the temperature sensitive substrate 30 for the purpose of calibrating the device. A first zone is coated with a layer 44 of a first temperature-sensitive, color responsive material and a second zone is coated with a layer 46 of a different temperature-sensitive, color-responsive material exhibiting a characteristically different color change at a different temperature. Both layers are over-coated with a sealing and encapsulating layer 48. When switch 38 is closed and the temperature raised by varying the resistance on rheostat 36 the substrate 30 will become overheated. When the temperature for color change in the first zone is exceeded, the layer 44 will change color and remain in the changed color state until the temperature is reduced. As the temperature is raised further the temperature for color change in the second zone will be exceeded and the layer 46 will change color and remain in that color state until the temperature is reduced. Neither the layers nor the overlying coating and sealing composition is affected or damaged by the period of heating nor by repetitive heating.

A specific example of practice follows.

EXAMPLE II

Equimolar quantities of about 0.52 g. of diphenylamine were mixed in solvent such as tetrahydrofuran with 0.74 g. of p-chloranil to form a bright blue-green solution. The solution was painted on the second zone of the surface to be monitored to form layer 46 as shown in FIG. 4. The solvent was evaporated and a tan or clear colorless melt resulted. Alternately the powdered chemical components may be mixed directly and applied to the surface to be monitored or may be sublimated and the vapors applied and condensed on the first zone to form a similar temperature sensing layer.

A layer 44 was formed on the first zone using a known mixture of 0.5 g. of diphenylamine and a corresponding equimolar amount of p-chloronitrobenzene. Thereafter a quantity of polyvinyl alcohol in water was painted or sprayed on layers 44 and 46 and allowed to evaporate in air for several hours to form a transparent, encapsulating layer 48. The switch 38 was closed and at a temperature of about 30° C. the layer 44 assumed a bright red-orange color and at about 37 to 38° C. a bright blue melt began to form in layer 46. At temperatures above 38° C. the layer 46 retains its bright blue appearance and layer 44 retains its bright red-orange color. Upon cooling below 38° C. layer 46 resumed a colorless appearance and upon cooling below 30° C. layer 44 assumed its essentially colorless condition. Various dinitro- and trinitrobenzene components may be substituted in place of the p-chloronitrobenzene giving similar orange or red colors. Additionally by varying the ratio of the two components the indicator temperature will correspondingly vary. For example, by varying the ratio of diphenylamine and p-chloronitrobenzene, the system will undergo sharp color changes between 30 and 40° C. This range is of interest for monitoring body temperatures.

A series of complexes varying in ratio of the donor-acceptor compounds were prepared and melted. The particular system investigated utilized diphenylamine and p-dinitrobenzene as the complex forming ingredients. The data appears in the following table.

TABLE II

| Sample No. | Diphenylamine, gram mole | p-Dinitrobenzene, gram mole (mol percent) | M.P. (° C.) | Color |
|---|---|---|---|---|
| 1 | 0.4 | 0.2 | 45-47 | Red. |
| 2 | 0.8 | 0.2 | 47-49 | Red. |
| 3 | 0.2 | 0.4 | 100-120 | Red. |
| 4 | 0.2 | 0.8 | | |
| 5 | 0.8 | 0.1 | 46-47 | Red. |
| 6 | 0.2 | 0.2 | 48-51 | Red. |

Figure 5:
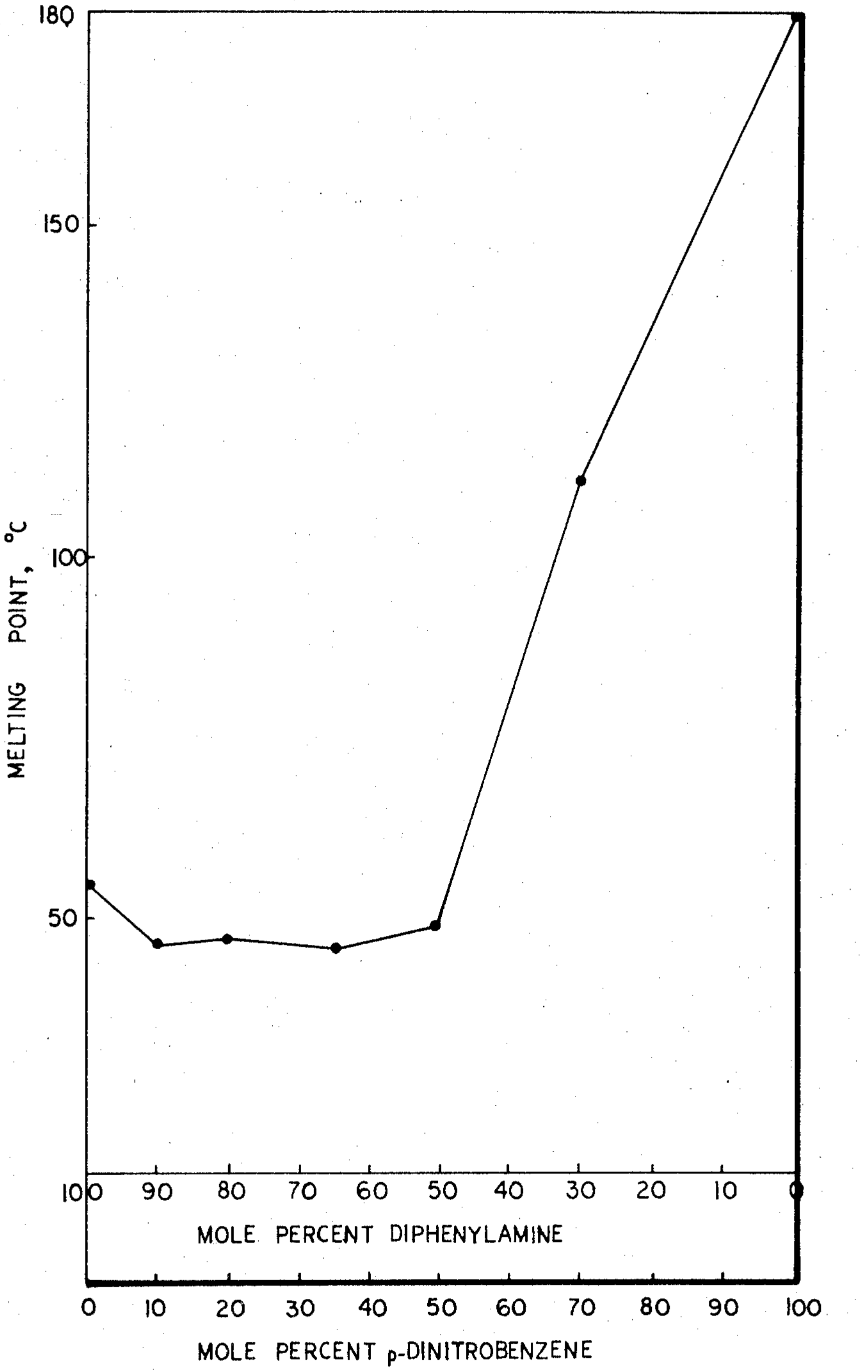
FIG. 5 is a graph of melting point for diphenylamine-p-dinitrobenzene mixtures.

The mixture changed in each case from a white color to a blood red color on being heated to melting temperature. The variation of melting point with composition ratio extends the range of usefulness of each composition. A curve illustrating the variation in melting point versus mole percent of dinitrobenzene is illustrated in FIG. 5. The samples were remelted after aging overnight. A slight increase in melting point was evidenced. A melting point curve for the chloranil-diphenylamine system exhibits similar characteristics.

The mixture of compounds may be applied to a substrate such as paper or cloth and encapsulated in clear resin and applied to the temperature sensitive substrate and the color change observed to indicate the temperature being sensed. Alternately the complexes may be dispersed and a clear polymeric matrix which may be molded or shaped into a desired probe form may be applied to the surface to be monitored. In another form of the invention, the dry mixture of weakly complexing donor and acceptor may be encapsulated between two sheets of clear thermoplastic resin such as polyethylene by placing the resin between the sheets and heat sealing the edges to form a contact temperature sensing probe device.

The inventive devices are applicable to heat sensing all types of electronic printed and integrated circuits and may be utilized in electronic color switching devices. The present invention constitutes a new approach to temperature sensing and provides a long-life, reversible, heat-detecting method suitable for integrated circuitry. Furthermore, the technique can be applied to micro-electronic components, which are too small, inaccessible or fragile to permit utilizing most conventional temperature measuring devices. The composition of the invention may also be utilized to measure temperatures of large areas simultaneously. Since color can be developed in a narrow temperature range, hot spots in electronic circuits mounted on very small areas will thus be capable of detection. The system could be applied to any instrument, apparatus, electrical conduit or the like where the danger of over-heating exists. The materials when encapsulated are non-toxic and therefore may be utilized to safetly measure human and animal body temperatures.

What is claimed is:

1. A thermochromic composition of matter comprising:
a mixture of particles of an electron donor material selected from the group consisting of organic amines, sterically hindered alkyl-substituted aromatic compounds and condensed ring aromatic compounds and particles of an electron acceptor material forming a weakly associated, colored complex with said donor material in the liquid state at a first temperature and assuming a dissociated state having a second color at a second temperature lower than the first temperature and being selected from the group consisting of nitro-substituted organic compounds, cyano-substituted organic compounds, cyclic ketones and heterocyclic compounds, said particles being substantially insoluble in water; and
a water-soluble, transparent binder material encapsulating and sealing said particles of donor and acceptor materials.

2. A composition according to claim 1 in which the mixture is selected from the group consisting of diphenylamine-p-chloranil and diphenylamine-p-chloronitrobenzene.

3. A composition according to claim 1 in which the mixture is dispersed throughout the layer of binder material.

4. A composition according to claim 1 in which the mixture underlies the layer of binder material.

5. A composition according to claim 1 in which the water soluble binder material is selected from the group consisting of acrylic and vinyl resins.

6. A composition according to claim 5 in which the resin is polyvinyl alcohol.

7. A composition according to claim 1 in which the donor is an organic amine, the acceptor is a nitro-substituted aromatic compound and the binder is a polyvinyl alcohol resin.

8. A composition according to claim 1 in which the donor material is selected from the group consisting of diphenylamine, triphenylamine, N,N-dimethylaniline, anthracene, naphthalene, pyrene, durene, tetrakis-(dimethylamono)-ethylene, hexamethyl benzene, tetramethyl-2-tetrazene, tetramethyl-2-thiourea, 1,3,5-tri-t-butylbenzene and tetra-i-propylbenzene.

9. A composition according to claim 8 in which the acceptor material is selected from the group consisting of chloranil, p-chloronitrobenzene, nitrobenzene, dinitrobenzene, 1,3,5-trinitrobenzene, tetranitromethane, trinitromesitylene, 2,2', 4,4', 6,6' -hexanitrobiphenyl, pyrazine, acridine, p-nitrobenzaldehyde, anthraquinone, tetracyanoethylene, and p-nitroanisole.

10. A composition according to claim 9 in which the binder material is a vinyl resin.

References Cited

UNITED STATES PATENTS

| | | | |
|---|---|---|---|
| 2,945,305 | 7/1960 | Strickler | 252—408 X |
| 3,445,291 | 5/1969 | Stein | 252—408 X |
| 3,471,422 | 10/1969 | Edlein | 73—356 X |
| 3,516,945 | 6/1970 | Finnie | 252—408 X |
| 3,521,489 | 7/1970 | Finkelstein | 252—408 X |
| 3,533,399 | 10/1970 | Goldberg | 128—2 |
| 3,576,604 | 4/1971 | Hammond | 252—408 X |

ROBERT F. BURNETT, Primary Examiner

M. E. McCAMISH, Assistant Examiner

U.S. Cl. X.R.

23—230 R; 73—356; 106—21; 116—114 V, 114.5; 219—201